United States Patent
Klerks et al.

(10) Patent No.: US 11,967,660 B2
(45) Date of Patent: Apr. 23, 2024

(54) PHOTOVOLTAIC BUILDING ELEMENT

(71) Applicant: Nederlandse Organisatie voor toegepast-natuurwetenschappelijk onderzoek TNO, s-Gravenhage (NL)

(72) Inventors: Stan Anton Willem Klerks, Rotterdam (NL); Karl Everhardus Sewalt, Schiedam (NL)

(73) Assignee: Nederlandse Organisatie voor toegepast-natuurwetenschappelijk onderzoek, TNO 's-Gravenhage (NL)

( * ) Notice: Subject to any disclaimer, the term of this patent is extended or adjusted under 35 U.S.C. 154(b) by 885 days.

(21) Appl. No.: 16/967,927

(22) PCT Filed: Feb. 13, 2019

(86) PCT No.: PCT/NL2019/050095
§ 371 (c)(1),
(2) Date: Aug. 6, 2020

(87) PCT Pub. No.: WO2019/160412
PCT Pub. Date: Aug. 22, 2019

(65) Prior Publication Data
US 2021/0367088 A1    Nov. 25, 2021

(30) Foreign Application Priority Data
Feb. 13, 2018 (EP) .................... 18156581

(51) Int. Cl.
*H01L 31/0392* (2006.01)
*H01L 31/048* (2014.01)
*H02S 20/26* (2014.01)

(52) U.S. Cl.
CPC ...... *H01L 31/03926* (2013.01); *H01L 31/048* (2013.01); *H02S 20/26* (2014.12)

(58) Field of Classification Search
CPC . H01L 31/03926; H01L 31/048; H01L 31/03; H01L 31/92; H01L 31/049; H02S 20/26; Y02B 10/10; Y02E 10/50
(Continued)

(56) References Cited

U.S. PATENT DOCUMENTS 6,215,060 B1 *   4/2001   Komori ................ B32B 27/308
                                                                         156/196

FOREIGN PATENT DOCUMENTS

DE    9312518 U1    11/1993
EP    1020930 A2    7/2000
(Continued)

OTHER PUBLICATIONS

European Patent Office, International Search Report in corresponding International Application No. PCT/NL2019/050095, dated Jul. 4, 2019 (2 pages).

*Primary Examiner* — Jasmine J Clark
(74) *Attorney, Agent, or Firm* — Leydig, Voit & Mayer, Ltd.

(57) ABSTRACT

A method of producing a photovoltaic element (1) comprises forming a photovoltaic member (11) on a first area (A1) of a support member (12), such that the photovoltaic member leaves a second area (A2) of the support member free, and bending the support member (12) in the second area (A2) so as to enhanced the rigidity of the photovoltaic element (1). The support member (12) is substantially planar and is capable of being permanently deformed by bending, while bending the support member (12) may be carried out immediately after forming the photovoltaic member (11).

20 Claims, 6 Drawing Sheets

(58) Field of Classification Search
USPC .......................................................... 438/64
See application file for complete search history.

(56) References Cited

FOREIGN PATENT DOCUMENTS

| EP | 2395560 A2 | 12/2011 |
|----|------------|---------|
| JP | H07202235 A | 8/1995 |

\* cited by examiner

PHOTOVOLTAIC BUILDING ELEMENT

CROSS-REFERENCE TO RELATED APPLICATIONS

This patent application is a U.S. National Phase of PCT International Application No. PCT/NL2019/050095, filed Feb. 13, 2019, which claims priority to European Application No. 18156581.3 filed Feb. 13, 2018, which are both expressly incorporated by reference in their entireties, including any references contained therein.

The present invention relates to a photovoltaic element and to a method of producing a photovoltaic element. More in particular, the present invention relates to a method of producing a photovoltaic element having a photovoltaic member applied on a support member.

International patent application WO 2013/121392 A1 discloses a flexible photovoltaic module consisting of silicon arranged on a flexible first backsheet, while a flexible second backsheet is then arranged on the opposite side of the first backsheet. The second backsheet is a metal plate, while a sheet of ethylene vinyl acetate is interposed between the first backsheet and the second backsheet. The photovoltaic module disclosed in WO 2013/121392 A1 is flexible and is produced in subsequent steps.

United States Patent Application US 2010/0242243 A1 discloses a machine and a method for adhering a flexible photovoltaic film from a roll onto metal supplied from another roll to form a combined solar and roof panel. Accordingly, the flexible photovoltaic film panels are made and stored on a roll before being applied to the metal. The combination of metal and photovoltaic film panels can then be processed in a rollformer.

There is a need for photovoltaic elements which can be used as roof panels or as wall or façade panels, and which are inexpensive, that is, which are simple to manufacture. It has been found that flexible photovoltaic elements are less suitable for use as roof panels or as wall or façade panels, and that photovoltaic elements suitable for such uses require a minimum amount of rigidity or stiffness. It is possible to first form flexible photovoltaic elements on a flexible film and then attach the resulting flexible photovoltaic element on a metal support member, as disclosed in US 2010/0242243 A1, or to first form flexible photovoltaic elements on a flexible first backsheet and then apply a second, metal backsheet, as disclosed in WO 2013/121392 A1. However, both Prior Art approaches are not efficient, as they involve plural processing steps.

The inventors have found that a photovoltaic element having a certain required rigidity can be more efficiently be produced by forming a photovoltaic member on a support member and then bending the support member so as to provide an enhanced rigidity. To this end the support member is provided with an outer area that is not covered with photovoltaic film panels and can be machined in an after process treatment, that is, after finalizing the formation of the photovoltaic member. The aftertreatment may be any operation including (laser) cutting, folding, bending, moulding, welding and press forming. This bending may result in bent edges of the support member, and/or a support member which exhibits an overall curvature.

By forming the photovoltaic member or members on the support member, preferably directly on the support member, any subsequent step of applying a support member to an already formed photovoltaic member, as in the Prior Art, can be omitted. Thus, the method of the invention is more efficient than Prior Art methods since the production of the support member can e.g. be carried out in a single lamination process on a substantially flat support. This in contrast to the prior art where a build module is separate from the photovoltaic module, and the integration thereof is done afterwards to produces photovoltaics that are essentially separately attached to the building object This attaching involves cumbersome handling of three dimensional build module objects such as a roof panel or wall cladding that can be dispensed with in the novel integration method.

Accordingly, the invention provides a method of producing a photovoltaic element, the method comprising:
  forming a photovoltaic member on a first area of a support member, such that the photovoltaic member leaves a second area of the support member free, and
  bending the support member in the second area so as to provide an enhanced rigidity of the photovoltaic element,
wherein the support member is substantially planar and is capable of being permanently deformed by bending, and wherein bending the support member is carried out immediately after forming the photovoltaic member.

By bending the support member immediately after forming the photovoltaic member, the photovoltaic element of the invention can be produced quickly and efficiently, possibly using a single machine.

The forming of such a photovoltaic member on an integrated support promotes ease of installation and connection to the standard home or building installation and adapted to the installation practice and provides standardization, uniformity and modularity.

A photovoltaic member may have its own functioning electrical infrastructure by means of integration of a micro inverter (e.g. for 230 V) on the substrate, and further including an interconnection components e.g. to connect to a powergrid. Such an integrated design has the benefits of utilizing lower module and/or system voltages which involves less stringent requirements and leads to increased product safety and ease of installation and maintenance. The photovoltaic members produced in this way can be designed as stand-alone plug & play elements comparable with other electrical components such as lighting devices which involves no specific project engineering. In another aspect of the invention a photovoltaic building element is formed wherein the photovoltaic members are connected by wiring circuitry integrally formed in the first area with the photovoltaic members, said wiring circuitry extending into the second area to and over the side walls. The wiring circuitry is preferably provided with interconnection components to electrically connect to another photovoltaic element or a power grid connection.

The support member may comprise a metal sheet, preferably a steel sheet or an aluminium sheet. Alternatively or additionally, the support member may comprise a bendable plastic sheet, such as a polycarbonate sheet or a polyacrylate sheet.

In some embodiments, at least the first area of the support member is transparent. This allows light to reach the photovoltaic member or members through the support member, which in turn allows the photovoltaic member or members to be arranged facing towards the support member instead of facing away from the support member. In this context, facing towards the support member implies that the light sensitive side of the photovoltaic member(s), if one side is more light sensitive than the other, is facing the support member.

In an embodiment, the support member has a thickness of between 0.5 mm and 4.0 mm, preferably between 1.0 mm and 2.0 mm. This allows the support member to have a sufficient flexibility while being able to be bent into a more rigid, that is less flexible, shape. The actual thickness used may depend on the overall dimensions of the photovoltaic element and on the material or materials of which the support member is composed.

In an embodiment, bending the support member may comprise locally heating the support member in the second area. Locally heating the support member increases its flexibility locally and temporarily, making bending easier and reducing the risk of mechanical damage to the photovoltaic member while bending.

Forming a photovoltaic member may comprise depositing semiconducting layers on the support member, the semiconducting layers preferably being made of cadmium telluride, copper indium diselenide, copper indium gallium diselenide, and/or amorphous silicon.

The support member may be coated prior to forming the photovoltaic member, for example by a weather-resistant coating to prolong its service life as a roof or wall panel.

The method of the invention may further comprise cutting or drilling in the support member in the second area after forming the photovoltaic member, the cutting or drilling preferably comprising laser cutting or laser drilling.

The invention also relates to a photovoltaic element produced by a method as described above. More in particular, the invention also relates to a photovoltaic element comprising a photovoltaic member formed on a first area of a support member, such that the photovoltaic member leaves a second area of the support member free, and the support member bent in the second area so as to provide an enhanced rigidity of the photovoltaic element, wherein the support member is substantially planar and is capable of being permanently deformed by bending immediately after forming the photovoltaic member.

Figure 6:
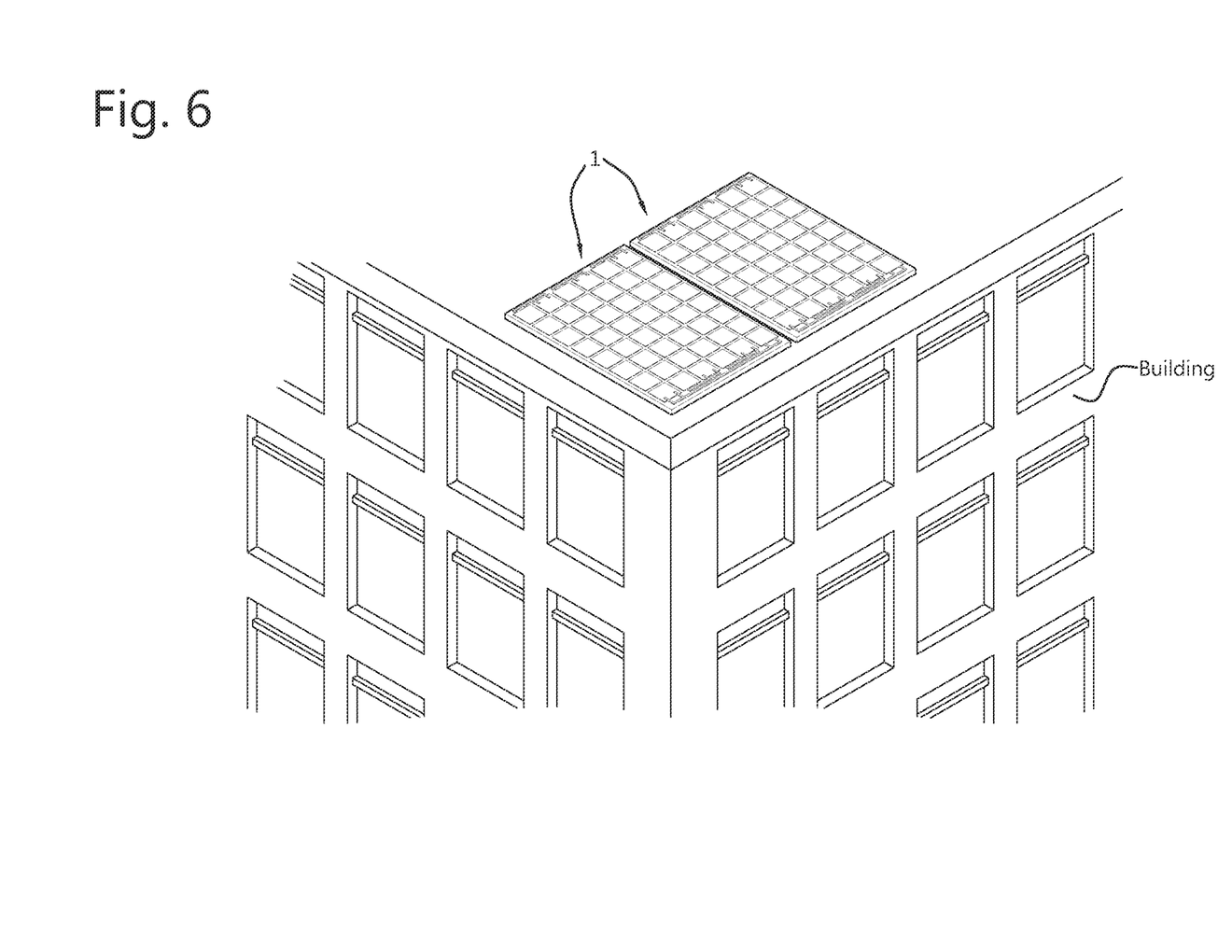
FIG. 6 illustratively depicts a building having a modular building element installed thereon according to the present invention.

The invention further provides a building, provided with a photovoltaic element as defined above. The building may be an office building (see e.g., FIG. 6), a residential dwelling, a parking garage or an airport terminal. Photovoltaic elements according to the invention may be arranged on the roof of the building and/or on its walls, including its façade.

The invention will further be explained by way of exemplary embodiments with reference to the accompanying drawings, in which.

The merely exemplary embodiment of a photovoltaic element 1 according to the invention schematically illustrated in FIG. 1a-1d comprises a photovoltaic member 11, a support member 12, semiconductor layers 13 and a transparent cover layer 14.

Figure 1A:
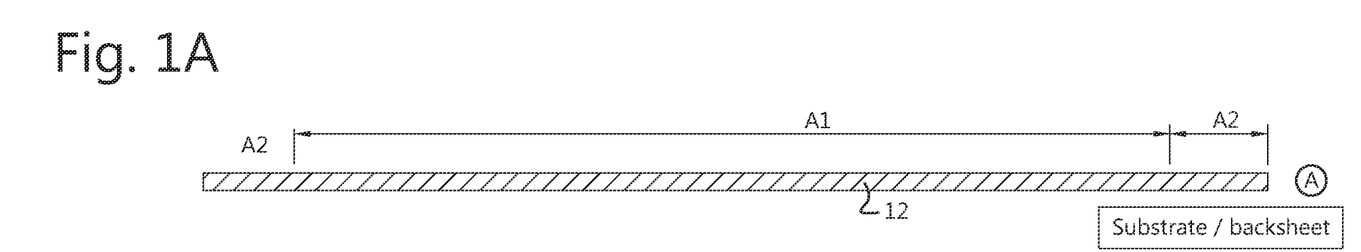
FIGS. 1a-1d schematically show a first embodiment of a photovoltaic element according to the present invention.
Figures 1B, 1C:
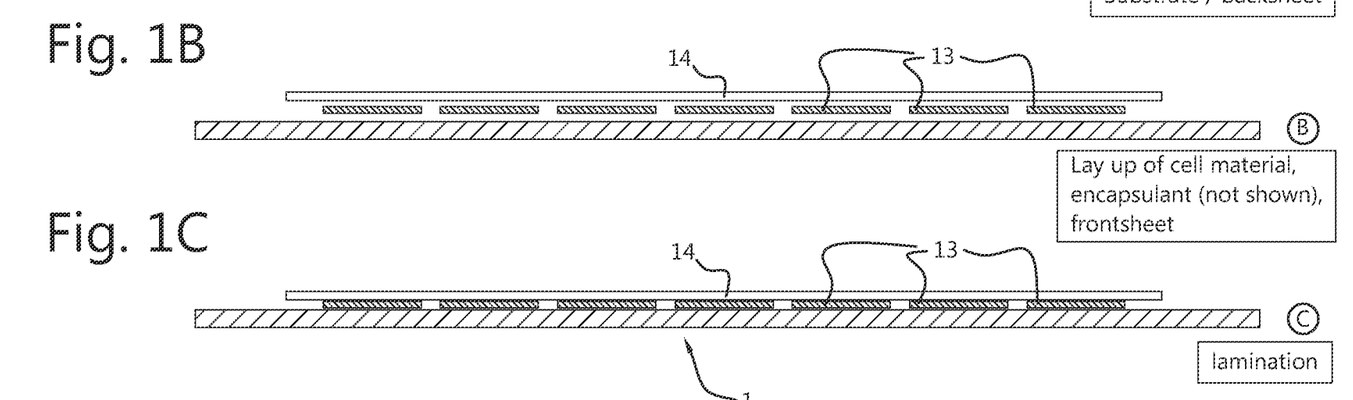

In step A (FIG. 1a), the support member 12 is provided. It is noted that the support member 12 may also be referred to as substrate or backsheet. The support member 12 of FIG. 1a is shown to have areas A1 and A2. In the example shown, the central are A1 will be covered by a photovoltaic member or members, while the remaining areas A2 will remain uncovered, or at least will not be covered by photovoltaic members. The photovoltaic members may be mono or polycrystalline silicon cells or flexible thin film cells, e.g. of an amorphous silicon, CdTe, CIGS, organic PV or Perovskite solar cell. The support member may be in the form of a back sheet 12, which may be typically a metal sheet, but could also be a composite material, or plastic such as transparent polycarbonate front sheet.

In step B (FIG. 1b), photovoltaic members 13 are applied to the support member 12 in the area A1. This applying may be carried out using conventional techniques, for example by vapour deposition of semiconductor material, or by any other suitable technique. In the embodiment shown, several photovoltaic members 13 are applied directly to the surface of the support member 12. An encapsulant (not shown), such as EVA (ethylene-vinyl acetate), may be applied. In step B, a cover layer 14 may also be applied. The cover layer or frontsheet 14 may be made of a transparent material, such as ETFE (ethylene tetrafluoroethylene) or PET (polyethylene terephthalate).

In step C (FIG. 1c), the members are laminated, preferably under vacuum and at a high temperature. A laminating technique may be used that is known per se.

In step D (FIG. 1d), the edges 121, corresponding with the areas A2 in step A (FIG. 1a), are bent using suitable tooling. By bending the edges 121, the rigidity of the photovoltaic element 1 is significantly increased. In the example shown, the edges 121 are both bent over approximately 90°, but other angles may also be used, for example 30°, 45°, 60° or 120°. Since the material is integrated in a build module, the support member material is able to be formed by bending, and has robustness and stiffness that enables attachment to a roof or wall. In an alternative setting, the build module is used as in infrastructural designs such as road cladding, or sound barriers.

The steps A-D may be carried out by a single machine, which offers the advantage of a fast production cycle.

Figure 1D:
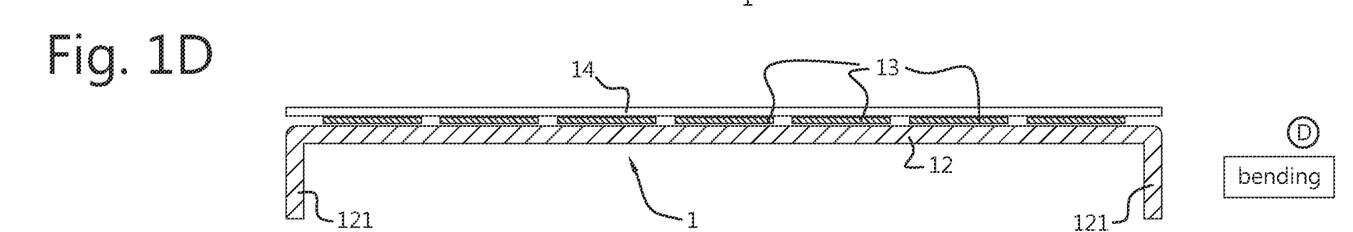
Figure 2A:
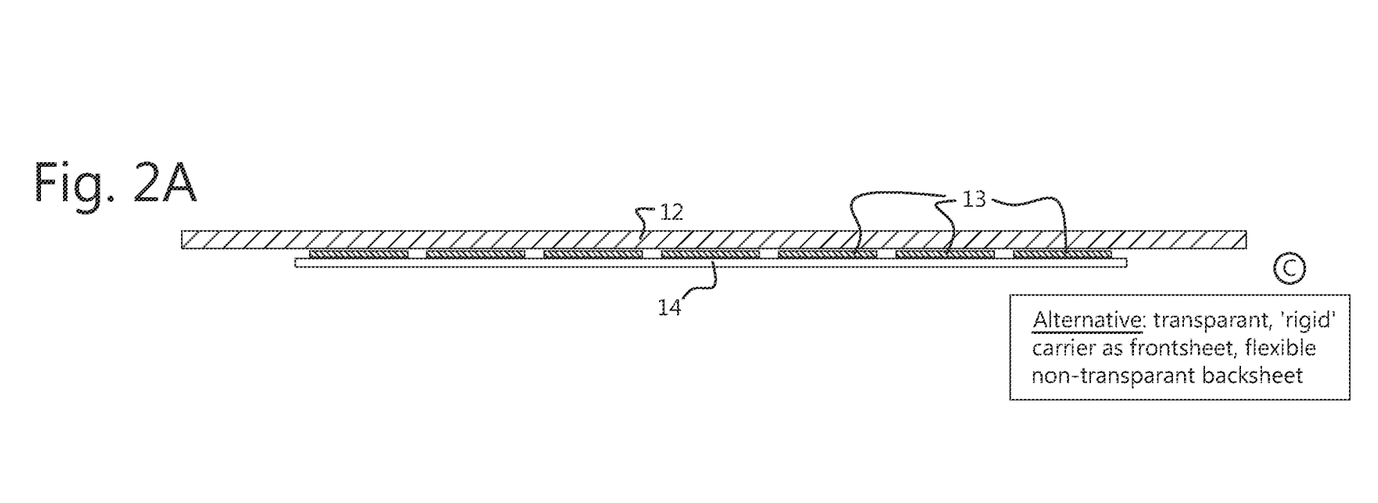
FIGS. 2a-2b schematically show a second embodiment of a photovoltaic element according to the present invention.
Figure 2B:
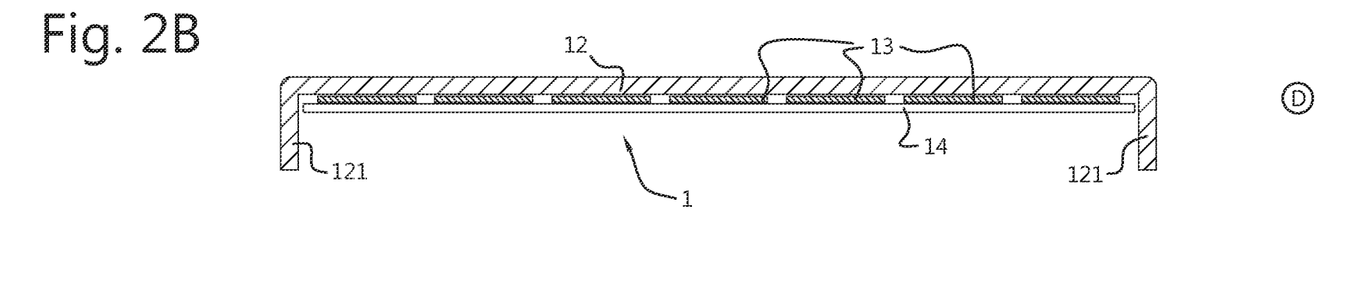

In the embodiment of FIGS. 2a-2b, the support member 12 is substantially transparent and may, for example, be made of transparent plastic, such as a transparent polycarbonate. In this embodiment, the support member 12 constitutes the transparent layer (that is, a transparent carrier) and the cover layer or backsheet 14 need not be transparent. As can be seen in FIGS. 2a and 2b, the photovoltaic elements 13 are located on the "inside", that is, at the side towards which the edges 121 are bent. In contrast, the photovoltaic elements 13 of FIG. 1d are located on the "outside", that is, at the side of the support member 12 the edges 121 are bent away from. Accordingly, it is shown that a photovoltaic building element (1) is formed comprising a plurality of photovoltaic members (11) formed in a first area (A1) of a support member (12), such that the photovoltaic members (11) leave a second area (A2) of the support member free and wherein the support member (12) in the second area (A2) is permanently deformed by bending thus providing a modular building element (1) with rigid side walls, and wherein the building element is formed from a single 2D pre shape.

Figures 3A, 3B:
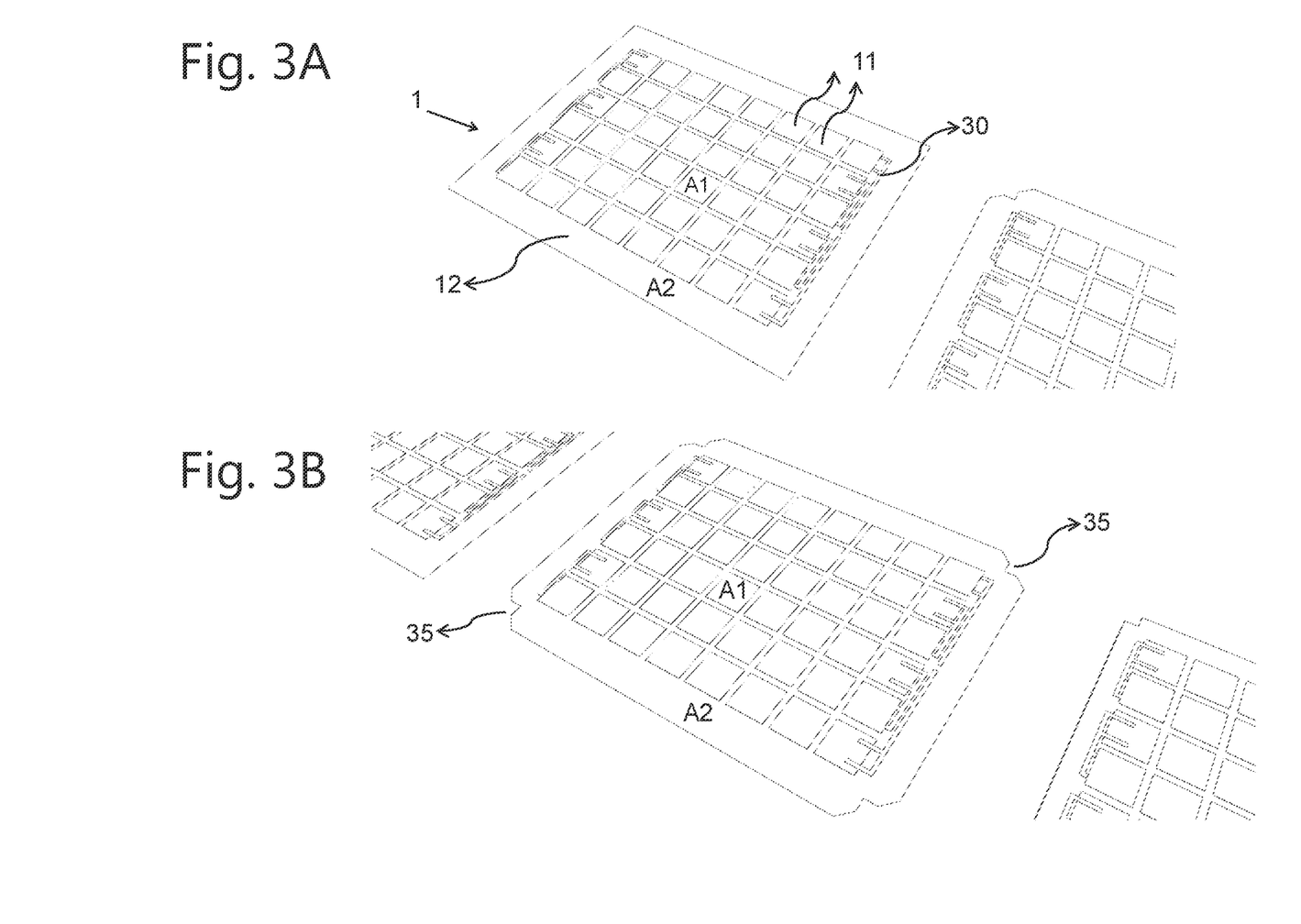
FIGS. 3-4 and 5 show subsequent phases of a laminar production process.
Figure 4A:
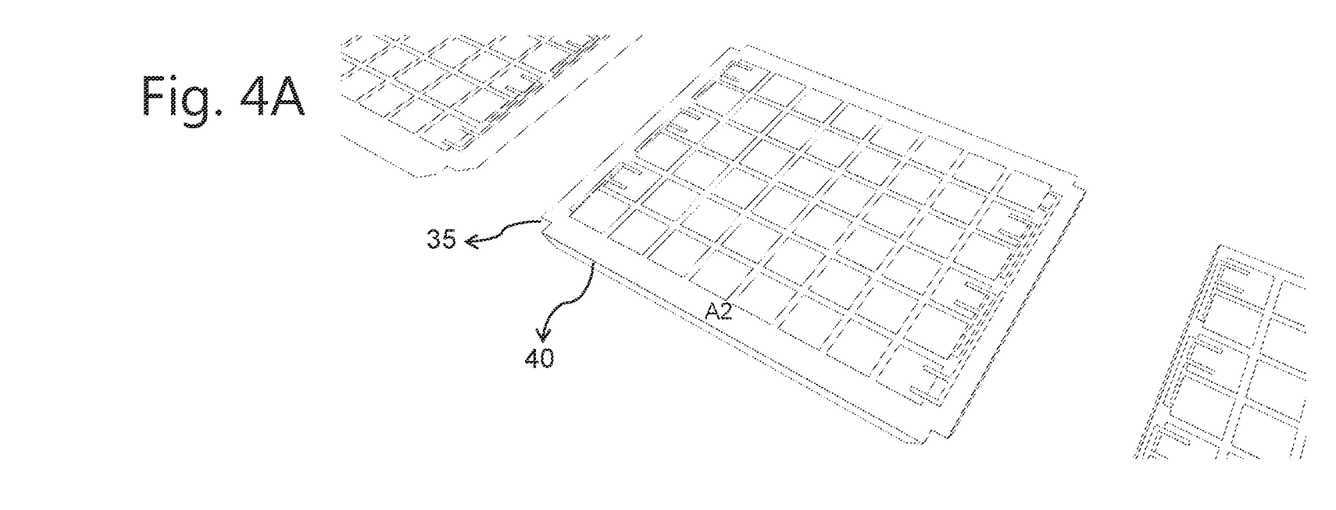
Figure 4B:
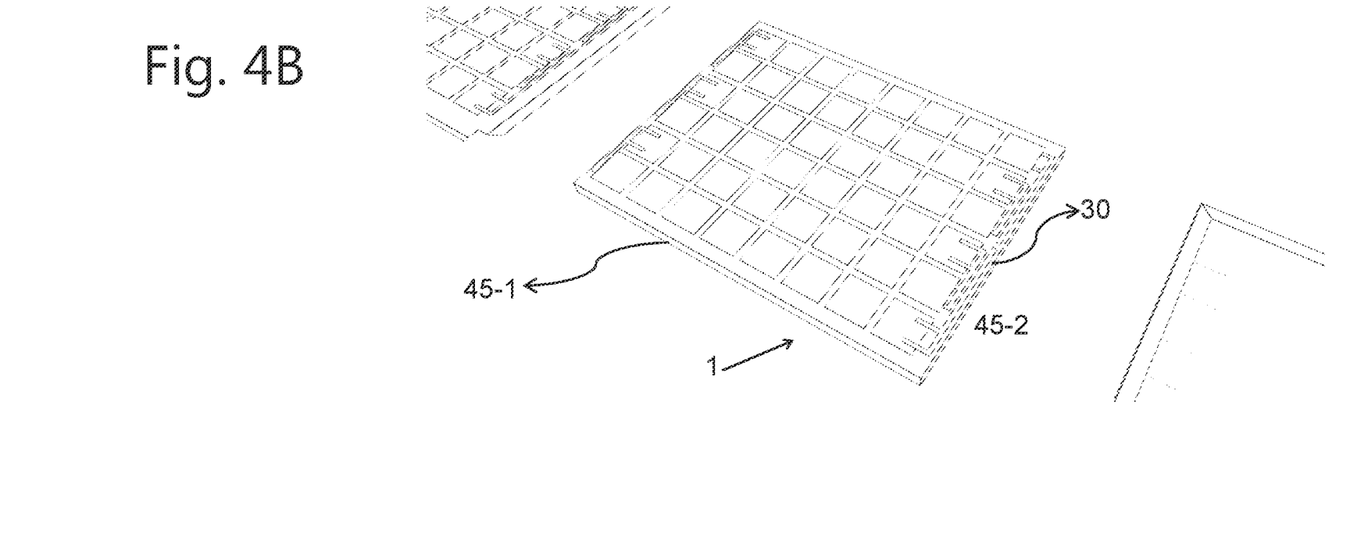
Figure 5:
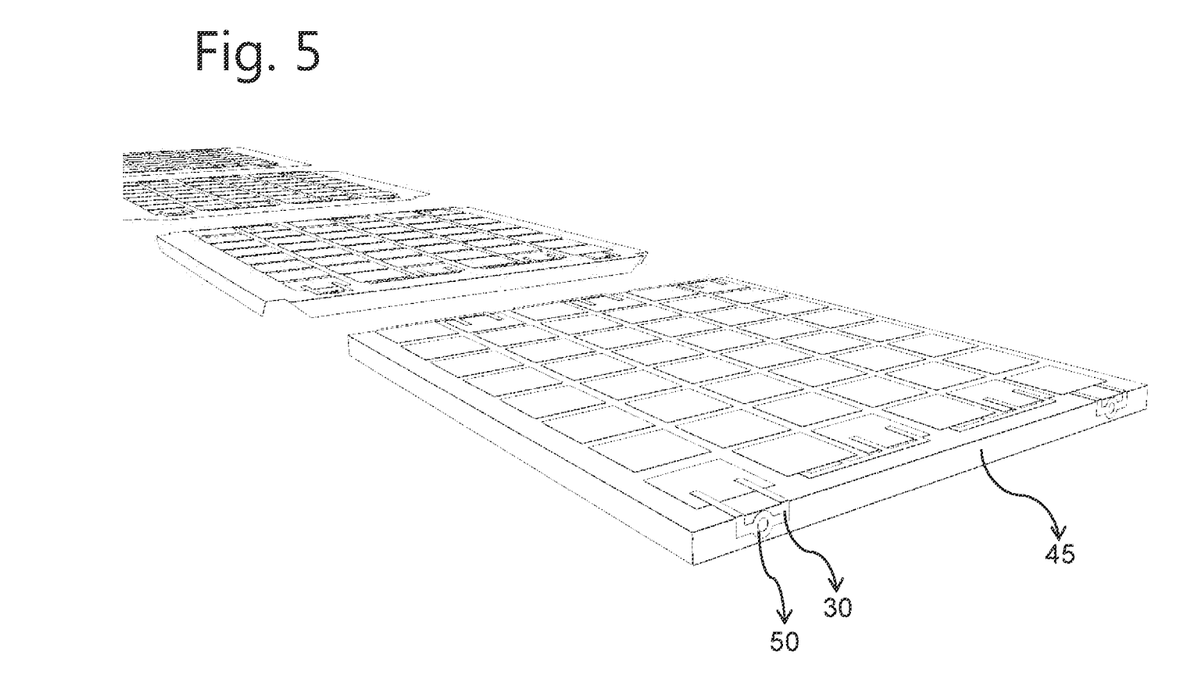

FIGS. 3-4 and 5 show subsequent phases of a laminate production process. In this process, FIG. 3A starts with a 2D preform formed by a planar support member 12 that has a photovoltaic member 11 formed thereon, e.g. by a conventional lamination process; in a first area (A1) of the support member (12). A second area (A2) of the support member 12 is kept free from photovoltaic members, but may comprise a laminating coversheet that may integrally cover photovoltaic members 11. In the area A2 to be machined wiring 30 may be provided that is produced to withstand a further formation process of forming the photovoltaic element as a 3D photovoltaic modular building element. The wiring 30 can be used to provide connection elements that connect on a side or lower face of the photovoltaic building element 1, i.e. a face different from the top face having the photovoltaic members 11 provided thereon, e.g. by lamination of a cover sheet (not shown).

In FIG. 3B a formation process is visualised, wherein the preform is cut in a corresponding folding shape, so that side walls (the second area A2) can be folded backwards, e.g. in a box form. To this end, the 2D preform has cuts 35, in particular provided on corners of the first area A1, that allow bending of the side walls in a box form shown in FIG. 4a.

In FIG. 4A a bending step is shown, to bend the 2D preform in a 3D shape defining the building element. To this end of an outer part of the second area A2 is bent so that a rim 40 is formed forming a backface of the box, substantially parallel to a planar front formed by the first area A1. In FIG. 4B, a further bending step is carried out, forming the box side walls 45. The cuts 35 define the bending lines, which can be carried out e.g. by conventional cold or hot press. Connective wiring patterns 30 extend from the first area into the second area, so that, in bent shape the wiring pattern extends on a side walls 45-2 of the boxed modular building element 1.

FIG. 5 shows a perspective view of the side walls 45 having the bent wiring pattern 30, extending from the photovoltaic members 11 and providing modular electrical connectivity between the photovoltaic building elements e.g. by a clamp or screw connection part 50. For example, the wiring pattern may be provided with an integrated micro inverter (e.g. for 230 V) on the substrate, and further including an interconnection components e.g. to connect to a powergrid. Accordingly it is shown that a photovoltaic building element is formed wherein the photovoltaic members (11) are connected by wiring circuitry integrally formed in the first area with the photovoltaic members, said wiring circuitry extending into the second area to and over the side walls 45. The wiring circuitry is preferably provided with interconnection components to electrically connect to another photovoltaic element or a power grid connection. It will be understood by those skilled in the art that the invention is not limited to the embodiments described above and that many additions and modifications are possible without departing from the scope of the invention as defined in the accompanying claims.

The invention claimed is:

1. A method of producing a photovoltaic element, the method comprising:
   forming a photovoltaic member on a first area of a support member, such that the photovoltaic member leaves a second area of the support member free; and
   bending the support member in the second area,
   wherein the support member is substantially planar before the bending, and
   wherein the support member is capable of being permanently deformed by the bending, and
   wherein the bending the support member is carried out immediately after the forming the photovoltaic member.

2. The method according to claim 1, wherein the support member comprises a metal sheet.

3. The method according to claim 1, wherein the support member comprises a bendable plastic sheet.

4. The method according to claim 3, wherein at least the first area of the support member is transparent.

5. The method according to claim 3, wherein the bendable plastic sheet is made of a material taken from the group consisting of: polycarbonate, and polyacrylate.

6. The method according to claim 1, wherein the support member has a thickness of between 0.5 mm and 4.0 mm.

7. The method according to claim 1, wherein the bending the support member is performed by locally heating the support member in the second area.

8. The method according to claim 1, wherein the forming a photovoltaic member comprises depositing semiconductor layers on the support member.

9. The method according to claim 8, wherein the semiconducting layers are made of one or more materials taken from the group consisting of: cadmium telluride, copper indium diselenide, copper indium gallium diselenide, and amorphous silicon.

10. The method according to claim 1, further comprising coating the support member prior to the forming the photovoltaic member.

11. The method according to claim 1, further comprising cutting or drilling into the support member in the second area after the forming the photovoltaic member.

12. The method according to claim 11, wherein during the cutting or drilling into the support member in the second area after the forming the photovoltaic member, the cutting or drilling is performed by one or more of the group consisting of: laser cutting and laser drilling.

13. The method according to claim 1, wherein the forming the photovoltaic member and the bending the support member are carried out without movement of the photovoltaic member after the forming and before the bending operations.

14. The method according to claim 1, wherein the support member comprises an aluminium sheet.

15. The method according to claim 1, wherein the support member has a thickness of between 1.0 mm and 2.0 mm.

16. A photovoltaic element produced using a method comprising:
   forming a photovoltaic member on a first area of a support member, such that the photovoltaic member leaves a second area of the support member free; and
   bending the support member in the second area,
   wherein the support member is substantially planar before the bending,
   wherein the support member is capable of being permanently deformed by the bending, and
   wherein the bending the support member is carried out immediately after the forming the photovoltaic member.

17. A building including the photovoltaic element according to claim 16.

18. A photovoltaic building element comprising
   a plurality of photovoltaic members formed in a first area of a support member, such that the photovoltaic members leave a second area of the support member free,
   wherein the support member in the second area is permanently deformed by bending thus providing a modular building element with rigid side walls, and
   wherein the building element is formed from a single 2D pre shape.

19. The photovoltaic building element according to claim 18, wherein the photovoltaic members are connected by wiring circuitry integrally formed in the first area with the photovoltaic members, said wiring circuitry extending to and over the side walls.

20. The photovoltaic building element according to claim 18, wherein the wiring circuitry is provided with interconnection components to electrically connect to another photovoltaic element or a power grid connection.

\* \* \* \* \*